FREQUENCY COMPENSATING SYSTEM

Filed Nov. 14, 1963 4 Sheets-Sheet 1

INVENTORS
PATRICK R. J. COURT
ABRAHAM REITER
BY Samuel Lindenberg
ATTORNEY

PATRICK R. J. COURT
ABRAHAM REITER
INVENTORS

BY Samuel Lindenberg

ATTORNEY

FREQUENCY COMPENSATING SYSTEM

Filed Nov. 14, 1963

FREQUENCY RESPONSE OF BROADBAND
I. F. CIRCUIT 40-47 MC (FIG. 5)

FREQUENCY RESPONSE OF RESTRICTED BANDWIDTH
I. F. AMPLIFIER 44.5-47.0 MC (FIG. 5)

FREQUENCY RESPONSE OF RESTRICTED BANDWIDTH
I. F. AMPLIFIER 17.7 - 20.2 MC (FIG. 5)

FREQUENCY RESPONSE OF
FINAL AMPLIFIERS 54 & 56
(FIG. 5)

INVENTORS
PATRICK R. J. COURT
ABRAHAM REITER
BY Samuel Lindenberg
ATTORNEY

PATRICK R. J. COURT
ABRAHAM M. REITER
INVENTORS

BY Samuel Lindenberg
ATTORNEY

United States Patent Office 3,299,359
Patented Jan. 17, 1967

3,299,359
FREQUENCY COMPENSATING SYSTEM

Patrick R. J. Court, Los Angeles, and Abraham M. Reiter, Reseda, Calif., assignors, by mesne assignments, to International Telemeter Corporation, Los Angeles, Calif., a corporation of New York Filed Nov. 14, 1963, Ser. No. 324,607
9 Claims. (Cl. 325—431)

This invention relates to circuit arrangements for compensating for local oscillator drift in superheterodyne type receivers and more particularly to improvements therein.

This application is a continuation-in-part of an application for Frequency Compensating System, Serial No. 310,377, filed September 20, 1963.

A familiar problem in superheterodyne receivers is that of maintaining the frequency accuracy of the local oscillator over the complete tuning range. Any error in the local oscillator frequency is directly transferred to the intermediate frequency output from the converter in the circuit. In radio or television receivers, with continuous type tuners, a local oscillator is varied in frequency to track the tuning range of the preselection circuits, thus yielding a relatively constant intermediate frequency output which may be amplified in subsequent circuits which are fixed-tuned to the intermediate frequency. The constancy or accuracy of the intermediate frequency output depends both upon the frequency stability and tracking accuracy of the local oscillator. The oscillator is usually arranged to be higher in frequency than the incoming signal by an amount equal to the nominal IF, and the higher the signal frequencies that are to be received, the more severe are the problems of maintaining adequate oscillator stability and of insuring proper tracking.

For VHF television reception, a television receiver usually incorporates a steptype tuner, either of the incremental or the turret type. In both types both the preselection circuits and the oscillator circuits are switched to appropriate frequencies to yield a nominal intermediate frequency output. With these arrangements the accuracy of the output intermediate frequency depends upon both the oscillator stability and upon its reset accuracy.

Television receiver manufacturers have acknowledged the existence of the problem of oscillator accuracy by furnishing a fine tuner control whereby the viewer can make his own compensation both for oscillator drift and for initial oscillator frequency errors. Because of manufacturing tolerances, attempts by manufacturers to dispense altogether with the fine tuner control have generally met with failure.

In remote control VHF television receivers, the local oscillator accuracy is even more significant, as the benefits of the remote control receiver are clearly negated if the viewer has to get up from his chair to adjust a fine tuner which has drifted or is incorrect to begin with.

With the present state of the tuner art, the better quality VHF tuners may have a frequency accuracy, including drift, in the neighborhood of ±100 kc. to ±150 kc., which for monochrome television is generally satisfactory, provided that some adjustment is available to the viewer in order to enable him to make the correct initial oscillator setting. With color reception, however, the requirements are more stringent than with monochrome. In a color television receiver, the intermediate frequency audio carrier has to be highly attenuated at the final video detector in order to avoid the presence of the 920 kc. interfering beat frequency which occurs between the color sub-carrier and the audio carrier.

As full bandwidth video is required, the sound traps which are generally used have a very high Q in order to achieve the necessary attenuation of approximately 60 db. In consequence, therefore, these traps have a useful bandwidth of no more than approximately 150 kc. If the television receiver is to remain correctly tuned, the oscillator drift must clearly not exceed this amount; otherwise, the disturbing 920 kc. interference will appear in the picture.

Since UHF tuner oscillators operate at frequencies 5 to 10 times greater than corresponding VHF tuners, and with the same percentage accuracy, the total frequency error is correspondingly greater. Frequency drifts of the order of ±350 kc. to ±750 kc. are not at all uncommon in UHF tuners, and considerable research is now being conducted by tuner manufacturers toward the achievement of UHF tuners with better characteristics.

UHF television receivers generally incorporate a continuous type tuner, the tuning range of which encompasses seventy television channels. For this reason, the tuning adjustment of such a receiver is generally very coarse and somewhat difficult for the uninitiated, particularly with color television. However, desirable as it may be, it is generally impracticable to provide a continuous type UHF tuner with a detent mechanism to select the wanted channel positions. The oscillator drift and tracking inaccuracies are such that at the detent positions, the accuracy of the intermediate frequency would be inadequate for proper reproduction of the picture and/or sound. The present state of the tuner art is such that the realization of an operation UHF television receiver without a fine tuner control is virtually impossible. The satisfactory application of remote control to a UHF television receiver is also exceedingly difficult because of similar considerations.

An object of this invention is the provision of a circuit arrangement for eliminating the adverse effects of tuner oscillator frequency error either due to drift, tracking or reset inaccuracy.

Another object of this invention is the provision of a circuit arrangement which provides a stable intermediate frequency despite tuner oscillator frequency error.

Yet another object of the present invention is the provision of a novel and useful arrangement for compensating the adverse effects of tuner oscillator frequency error.

These and other objects of the invention may be achieved in an arrangement wherein the output signal from the tuner, which includes the error due to the tuner oscillator, is applied to a first mixer or frequency converter and also to a second mixer or frequency converter. A stable local oscillator applies its output as a second input to the first mixer. An output is derived from the first mixer which comprises the difference between the two inputs. This first mixer output is applied to the second mixer as a second input. The output of the second mixer is taken as the difference of the two inputs. This output comprises a signal having the frequency of the stable local oscillator. This second mixer output can then be handled by the receiver in the same manner as was the output of the tuner heretofore, namely, as the intermediate frequency.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
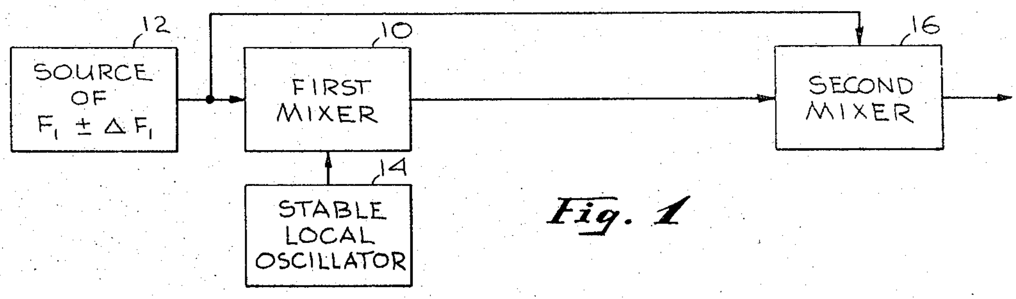
FIGURE 1 is a block diagram of a simplified arrangement in accordance with this invention.

Reference is now made to FIGURE 1, which is a simplified block diagram of this invention, shown for the purpose of simplifying the explanation thereof. A first mixer 10 receives as one input a signal from a source 12. This signal, $F_1$ is not a constant frequency, but has a tolerance of $\pm\Delta F_1$. The input to the first mixer therefore is $F_1\pm\Delta F_1$.

A second input to the first mixer is the output of stable local oscillator 14. The frequency of this local oscillator output may be defined as $F_0\pm\delta F_0$. The output of the first mixer may be selected as the difference between the signal frequency and the local oscillator frequency, which is $(F_1\pm\Delta F_1)-(F_0\pm\delta F_0.)$ This frequency, which may be defined as the injection frequency, is applied as a first input to a second mixer 16. The second input to the second mixer is the original signal frequency $F_1\pm\Delta F_1$.

The output of the second mixer 16 may be selected as the difference between the signal frequency and the injection frequency, which is equal to $F_0\pm\delta F_0$. This is, of course, identical to the frequency of the stable local oscillator.

As an alternative to taking the injection frequency as the difference of the signal frequency and the local oscillator frequency, it may be taken as the sum of the signal frequency and the local oscillator frequency. The injection frequency would then be $(F_1\pm\Delta F_1)+(F_0\pm\delta F_0)$. The output of the second mixer can then be taken as the difference between the injection frequency and the signal frequency, which would again be $F_0\pm\delta F_0$, and which is again, of course, identical to the oscillator frequency.

In both alternatives, the frequency of the output of the second mixer 16 is entirely independent of the signal frequency input to the first mixer. It depends entirely upon the frequency of the local oscillator 14 and is in fact identical thereto.

Figure 2:
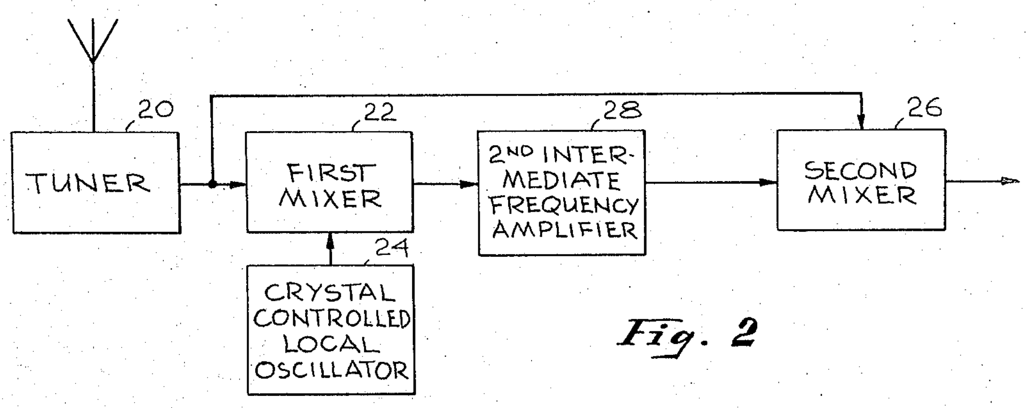
FIGURE 2 is a block diagram illustrating how the embodiment of the invention is employed in a receiver.

FIGURE 2 is a block diagram of an arrangement in accordance with this invention for correcting errors in the intermediate frequency output of a tuner. The tuner 20 comprises the front end of any receiver and includes the tracking local oscillator whereby a received signal may be heterodyned to an intermediate frequency. Let us designate this intermediate frequency as $F\pm\Delta F$, whereby F is the desired intermediate frequency and ΔF is the error which occurs as a result of the tracking oscillator not tracking too well or drifting. The output of the tuner at the frequency of $F\pm\Delta F$ is applied to a first mixer 22. A stable local oscillator 24 applies its output at a frequency $F_0$ to the first mixer as a second input thereto. Assuming that the local oscillator is crystal controlled, its tolerance $\pm\delta F_0$ may be considered to be so small in comparison with $\pm\Delta F$ that it may be hereafter ignored.

The first intermediate frequency output of the tuner 20 is here assumed to be an amplitude modulated carrier, and it is desired that the final output of a second mixer 26 consist also of an amplitude modulated carrier, the modulation envelope of which is a faithful reproduction of the modulation envelope conveyed on the first intermediate frequency carrier F.

The output of the first mixer 22 is selected as the difference between the first intermediate frequency and the local oscillator frequency, which is $(F\pm\Delta F)-F_0$. This frequency will hereinafter be designated as the second intermediate frequency (or the injection frequency). This signal is amplified in a second IF amplifier 28. The output of the second IF amplifier is applied to the second mixer 26. A second input to the second mixer is the first IF signal $(F\pm\Delta F)$. The purpose of the amplifier 28 is to cause the amplitude of the second IF carrier $(F\pm\Delta F)-F_0$, to be substantially greater in amplitude at the second mixer than the first IF carrier $F\pm\Delta F$ so that the second IF carrier assumes the role of an oscillator injection for the conversion of the $F\pm\Delta F$ carrier to the final intermediate frequency.

The final intermediate frequency, which comprises the output of the second mixer, 26, is chosen as the difference between the two inputs which has a frequency of $F_0$.

The amplitude relationship of the two carrier inputs to the second mixer, which may be more accurately considered to be an intercarrier mixer, is chosen such that the peak amplitude of the first IF carrier is less than the minimum amplitude of the second IF carrier. It is a well known property of a mixer that the amplitude of the output signal is substantially independent of the amplitude variations of the larger of the two input signals. Thus, the amplitude modulation envelope of the final IF output of the second mixer 26 is principally dependent upon the amplitude modulation envelope of the first IF carrier and largely independent of the amplitude modulation envelope present on the second IF carrier. If the amplitude relationship described were not so chosen then the output of mixer 26 would have a modulation envelope corresponding to the product of the modulation envelopes of the two inputs. Although these two input modulation envelopes are derived from the same source, namely the output of the tuner 20, they are not identical since the signal paths are not identical.

Figure 3:
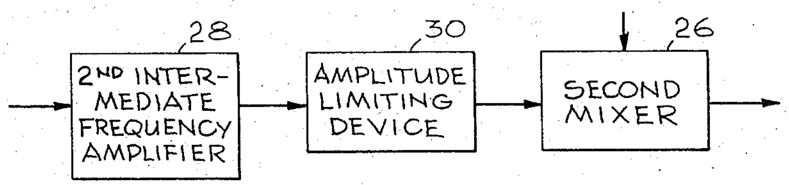
FIGURE 3 is a block diagram of a portion of FIGURE 2 illustrating how the effects of amplitude modulation on the injection frequency carrier signal may be minimized.

It may be desirable for the purpose of removing the amplitude modulation upon the second IF carrier to interpose an amplitude limiting device. This is shown in FIGURE 3. An amplitude limiting device 30 is interposed between the output of the second intermediate frequency amplifier 28 and the input to the second mixer 26. The amplitude limiting device 30 may consist of any one of a number of suitable arrangements such as a locked oscillator, which yields a constant amplitude output at the same phase and frequency as the varying amplitude input signal, or a beam deflection tube of the type 6AR8 or 6BN6. As a result of using the amplitude limiting device, the injection frequency, or second IF, which is applied to the second mixer 26 is substantially without any amplitude modulation. Thus, the output of the second mixer 26 at the frequency of the crystal controlled local oscillator will only bear the amplitude modulation of the input received from the tuner 20.

The arrangement in accordance with either FIGURE 2 or FIGURE 3 produces a final intermediate frequency $F_0$ which is exactly equal to the frequency of the local oscillator 24 regardless of the error component $\pm\Delta F$ which is present on the first intermediate frequency output F of the tuner 20, and which carries an amplitude modulation envelope which is substantially identical to that of the first IF carrier.

Figure 4:
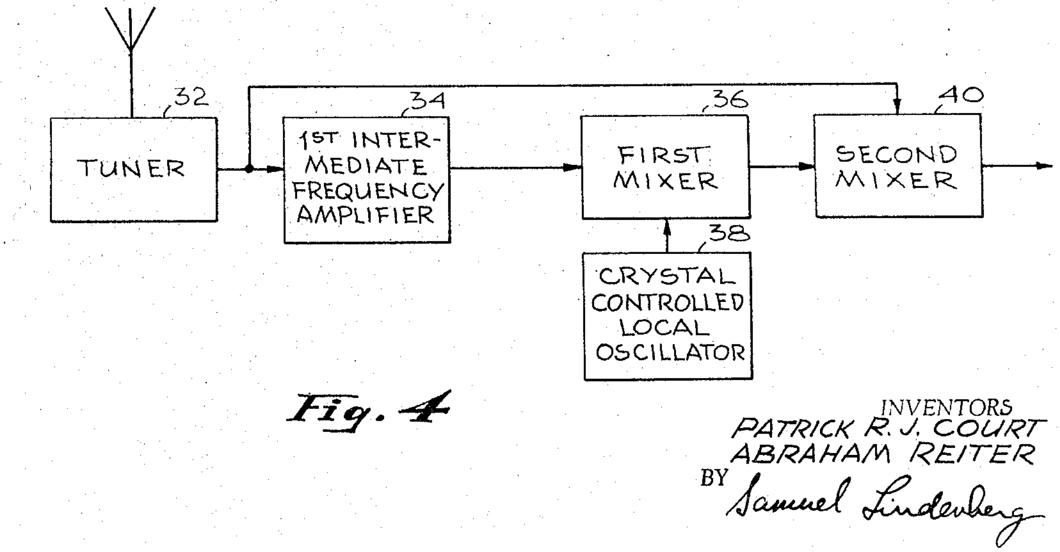
FIGURE 4 is a block diagram of another arrangement of the embodiment of the invention in a receiver.

FIGURE 4 is a block diagram of a preferred alternative arrangement to the embodiment of the invention shown in FIGURE 2. The tuner 32 delivers a first intermediate frequency signal which has a frequency F with an error component of $\pm\Delta F$, corresponding to the inaccuracies of the oscillator within the tuner 32. This first IF signal is amplified in a first IF amplifer 34 and is thereafter applied as a first input to a first mixer 36. A stable local oscillator 38, which is preferably crystal controlled, applies an output at a frequency $F_0$ to the first mixer 36. The gain of the first IF amplifier 34 is arranged to be such that the minimum carrier amplitude of the first IF signal $F \pm \Delta F$ is greater than the constant amplitude of the local oscillator signal $F_0$. The output of the first mixer, which is chosen as the difference between the two frequencies $(F \pm \Delta F) - F_0$ is thus a relatively constant amplitude, as it is largely independent of the amplitude excursions of the first intermediate frequency carrier.

The output of the first mixer is used as an oscillator injection signal for a second mixer 40. The second input to the second mixer is the first IF signal $F \pm \Delta F$. The amplitude of the injection signal is arranged to be greater than the peak amplitude of the first IF carrier $F \pm \Delta F$. The output of the second mixer 40, which may be more accurately considered to be an intercarrier mixer, is chosen as the difference between the two input signal frequencies and, thus, is again equal to $F_0$. The amplitude of the final IF output of the second mixer is substantially independent of the amplitude of the injection frequency signal and depends principally on the amplitude excursions of the lesser first IF signal.

The advantage of the arrangement shown in FIGURE 4 is that there are effectively two successive stages of amplitude limiting in the two mixers instead of only one as in the arrangement disclosed in FIGURE 2. Thus, if the first mixer 36 achieves a limiting ratio of 10 to 1, then only 10 percent of the amplitude modulation of the first intermediate frequency input will appear in the second intermediate frequency or injection frequency. If the second mixer 40 also has a limiting ratio of 10 to 1, then only 10 percent of the remaining amplitude modulation on the second IF input will appear on the final IF output. The overall improvement is thus the product of the two ratios, which is 100 to 1. It may be desirable to additionally interpose an amplitude limiting device and, if so, this may be interposed between the first intermediate frequency amplifier and the first mixer.

Figure 5:
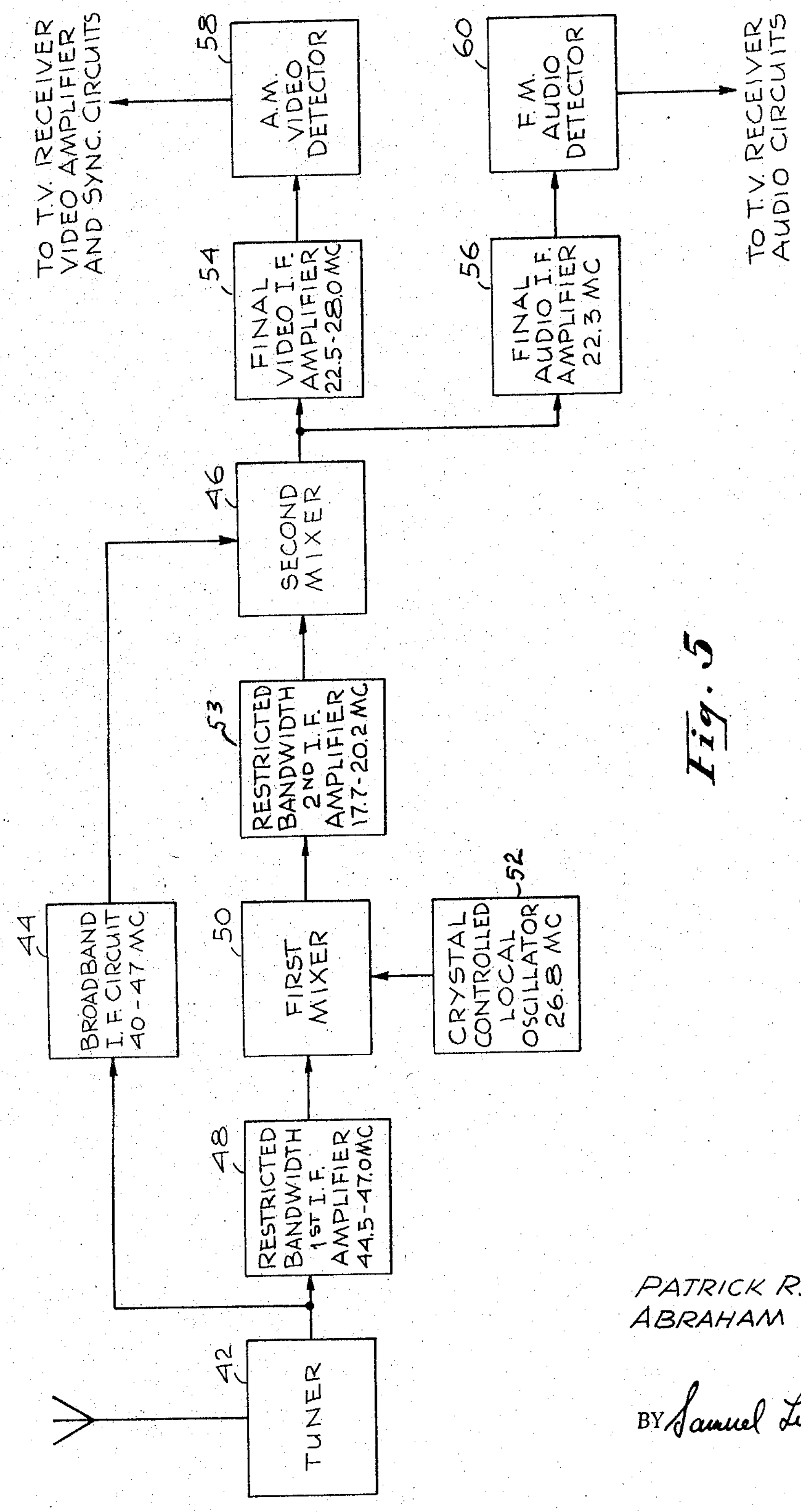
FIGURE 5 is a block diagram illustrating how the embodiment of the invention can be used in a television receiver.

FIGURE 5 is a block diagram illustrating how the embodiment of the invention may be utilized in a television receiver. The receiver has a standard tuner 42 which may be either a UHF tuner or a VHF tuner. It is assumed that this tuner 42 converts the signal frequencies at its input to standard intermediate frequencies at its output, which are nominally 45.75 mc. for the video carrier and 41.25 mc. for the audio carrier. Due to inaccuracies in the frequency of the oscillator which is incorporated in this tuner, these IF carrier outputs are assumed to have a frequency tolerance of $\pm \Delta F$. As discussed previously, $\Delta F$ may be quite large and perhaps on the order of 750 kc. if tuner 42 is a UHF tuner.

The first IF carriers are applied to a broadband IF amplifier circuit 44 which applies them as a first input to a second mixer 46. The bandwidth of this broadband IF circuit extends from 40 to 47 mc. in order that no deterioration of signals can occur, even with values of $\Delta F$ as large as 1.25 mc. The broadband IF circuit 44 can, therefore, accommodate a total of $\pm \Delta F$ of 2.5 mc.

Figure 6:
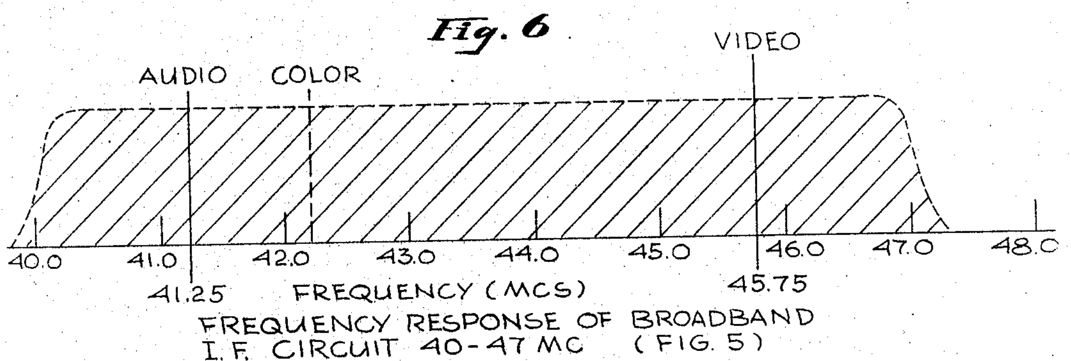
FIGURES 6, 7 and 8 are wave shape diagrams which are shown to assist in an understanding of the operation of the embodiment of the invention shown in FIGURE 5.
Figure 7:
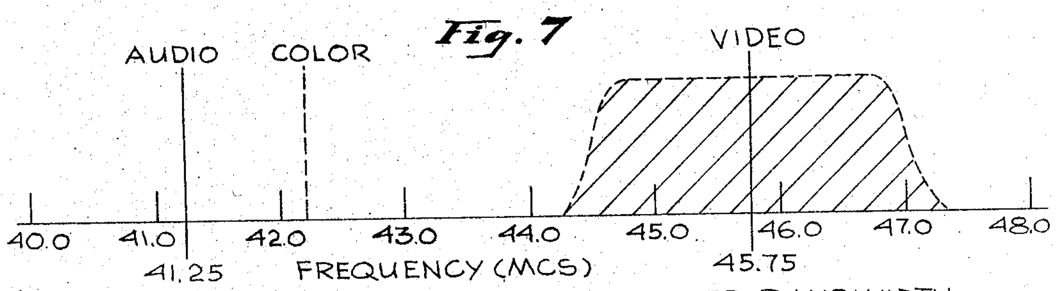

The first IF output of the tuner 42 is also applied to a restricted bandwidth IF amplifier 48. In connection with the description of FIGURE 5, reference hereafter will be made to the wave shape drawings shown in FIGURES 6, 7, 8 and 9. FIGURE 6 shows a curve which represents the frequency response of the broadband IF circuit, and also illustrates the disposition of the audio and video carriers and the color subcarrier therein. FIGURE 7 shows a curve representing the frequency response of the restricted bandwidth IF amplifier 48. It will be seen that the response of the amplifier 48 is centered around the first IF video carrier. It will also be seen in FIGURE 7 that the bandwidth has been chosen to extend from approximately 44.5 mc. to 47.0 mc. and will thus accommodate a total frequency variation of this carrier $(\pm \Delta F)$ of 2.5 mc. The response of amplifier 48 is designed to reject completely the first IF audio carrier which is nominally at 41.25 mc. as well as the color subcarrier, if present, which is nominally at 42.17 mc.

The gain of the restricted bandwidth amplifier 48 is such that it delivers the amplified first IF video carrier as a first input to the first mixer 50 at a level which is substantially greater than the second input to the first mixer derived from the stable local oscillator 52. The local oscillator 52 is preferably crystal-controlled and is here chosen to oscillate at a frequency of 26.8 mc. The output of the first mixer is chosen as the difference between the first IF video carrier and the crystal controlled local oscillator frequency, producing a difference frequency nominally at 18.95 mc. This output frequency, designated here as the second IF, will carry with it the frequency variations of the first IF carrier $\pm \Delta F$ in the same sense. Provided that the minimum amplitude the first IF video carrier input to the first mixer 50 is greater than the constant amplitude of the input from the crystal controlled local oscillator 52, the amplitude of the second IF carrier, which is the output of the first mixer 50, will be substantially independent of the amplitude excursions of the input first IF video carrier. Therefore, the second IF carrier which is the output of the first mixer, will have a substantially constant amplitude.

Figure 8:
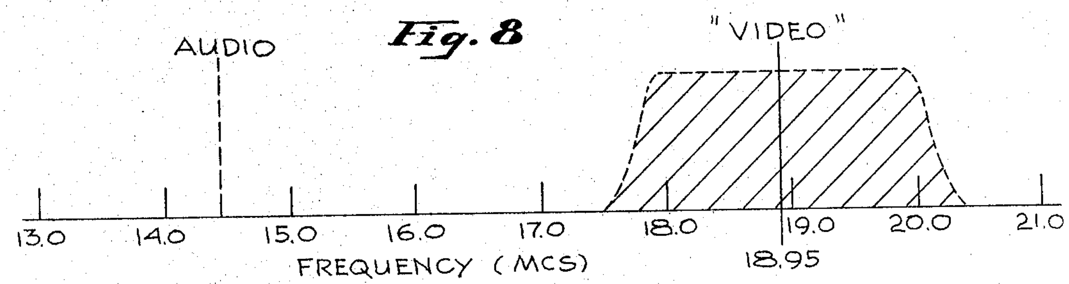

This second IF carrier is applied to a restricted bandwidth second IF amplifier 53, the frequency response of which is shown in FIGURE 8. It will be seen from FIGURE 8 that the passband of this amplifier is chosen to extend from approximately 17.7 mc. to 20.2 mc. or a total of 2.5 mc. which is the same as the bandwidth of the amplifier 48. The amplifier 53 will thus accommodate the same frequency excursion $(\pm \Delta F)$ of the converted carrier as does the amplifier 48.

After amplification by amplifier 53, the now relatively constant amplitude second IF carrier is delivered to the second mixer 46 as a second input, and its amplitude is arranged to be substantially greater than that of the first input which, it will be remembered, is the output of the broadband IF circuit 44. The output of the second mixer 46 is chosen as the difference between the two inputs. For the video carrier, the output is $$(45.75 \text{ mc.} \pm \Delta F) - (18.95 \text{ mc.} \pm \Delta F)$$

which equals 26.8 mc. as the two equal $\pm \Delta F$ components cancel. It will be noted that this is precisely the frequency of the crystal controlled local oscillator 52. For the audio carrier, the output is $$(41.25 \text{ mc.} \pm \Delta F) - (18.95 \text{ mc.} \pm \Delta F)$$

which is 22.3 mc. Here too, the two equal error components again cancel. Provided that the amplitude relationship is correct in the second mixer the amplitude of these output carriers will depend only upon the amplitude of the first IF carriers which form the first input to the second mixer, and so the modulations on these carriers will be faithful replicas of the modulations on the carriers which form the output of the tuner 42.

The significance of the second mixing process is that the two $\pm \Delta F$ components are cancelled by subtraction and the first IF carrier outputs of the second mixer 46 have the frequency precision of the crystal controlled local oscillator 52. In view of the bandwidths of the IF amplifiers which are chosen, errors in the first IF carrier of $\pm 1.25$ mc. can be accommodated without deterioration. The frequency of the crystal controlled local oscillator, even if it is of the most ordinary design, will have a frequency tolerance of only a few hundred cycles, and so the system, as described, can yield improvements in intermediate frequency stability of the order of 1,000 to 1. The actual improvement ratio is limited only by the provision of the local oscillator.

Figure 9:
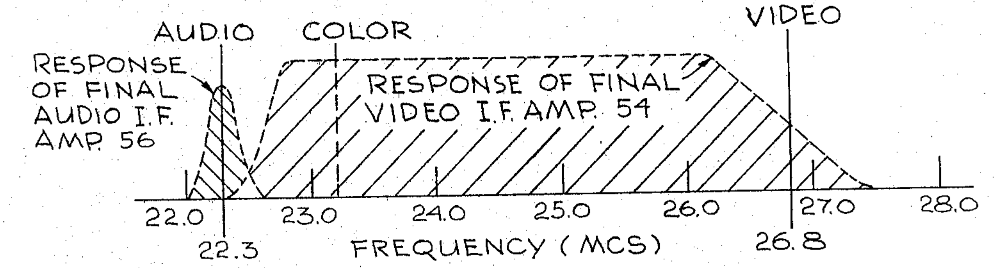
FIGURE 9 is a response characteristic wave shape desired for a final intermediate frequency amplifier to compensate for "ghost" images caused by some mixers.

The third IF carrier outputs from the second mixer 46 are delivered to the final video IF amplifier 54 and to the final audio IF amplifier 56 after being previously separated by circuits well known to those skilled in the art. The final video IF amplifier 54 incorporates all of the normal circuits for properly shaping the response, attenuating the audio carrier, etc., and a typical overall amplitude characteristic is represented in FIGURE 9. The output of the final video IF amplifier is demodulated by an AM video detector 58; the output of which is ultimately passed to the conventional television receiver video amplifier and synchronizing circuits. The frequency response of the final audio IF amplifier 56 is also shown in FIGURE 9, and its output is demodulated by the FM audio detector 60. The output of the audio detector is thereafter presented to the conventional television receiver audio circuits.

It will be noted that the television receiver block diagram of FIGURE 5 incorporates a "split sound" type of audio system, wherein the audio carrier is amplified and demodulated at the final IF frequency rather than at the usual 4.5 mc. intercarrier sound frequency. A reason for describing this arrangement is to underscore another secondary benefit of the intermediate frequency stabilizing system.

It will be recalled that early split sound type television receivers would suffer from microphony caused by audio vibrations from the loudspeaker in the oscillator section of the tuner. Sound waves from the loudspeaker would vibrate the electrode structures in the oscillator tube, causing changes in the inter-electrode capacities which resulted in an additional frequency modulation of the IF carrier outputs of the tuner, sympathetic with the sound modulation. These frequency modulations were detected by the FM detector, and an acoustical feedback path thus resulted, which caused oscillation of the overall receiver. It was a common feature of such receivers that the oscillator tube was enclosed in a heavy lead shield in an attempt to damp out the vibrations due to the sound waves from the loudspeaker and thus minimize the problem. This situation prevailed until the invention of intercarrier sound wherein the sound is recovered as the intercarrier difference frequency between the audio and video carriers, in which the microphonic frequency excursion of the carriers is cancelled. Most television receivers today incorporate intercarrier sound, which, however, is attended by a potential problem called intercarrier buzz, resulting from the transfer of video modulation to the audio carrier.

With the intermediate frequency stabilizing system as described above, any microphonic frequency modulation of the first intermediate frequency carrier outputs from the tuner is treated as an additional $\pm\Delta F$ component which is completely cancelled. It is thus possible in a television receiver incorporating this system to employ a split-sound IF system if desired without experiencing the problems discussed in detail above. At the relatively low frequency of the local oscillator, particularly if it is crystal controlled, it will not be subject to microphonic frequency modulation by the loudspeaker as will the oscillator in the tuner.

Alternatively, of course, intercarrier sound detection can be used if desired.

The particular frequencies selected for the local oscillator and hence the restricted bandwidth IF amplifier are by way of example only and are not to be construed as a limitation. The frequencies are chosen as a result of consideration of harmonic generation and higher order conversions in the two mixers and the need to eliminate them from the second and final intermediate frequency passbands.

The use of a final IF at 22 mc. to 28 mc. has no effect upon the image rejection characteristics of the receiver because the first IF is in the normal position (41 mc. to 47 mc.). In other words, tuner 42 is a standard tuner, and its image properties are dependent upon the first IF conversion only and not upon any subsequent conversions.

With some types of mixer circuits it may be noted that the reproduced picture manifests a slight delayed background image or "ghost." Upon analysis, it is found that phase modulation of the converted video carrier output from the first mixer can occur because of the substantial amplitude swing of the first IF video carrier input. The phase modulation, if it occurs, will be demodulated by the video detector because of the sloping amplitude characteristic in the region of the video carrier of the final intermediate frequency amplifier response (FIGURE 9). The demodulated PM signal will be superimposed upon the demodulated AM signal as a ghost.

Figure 10:
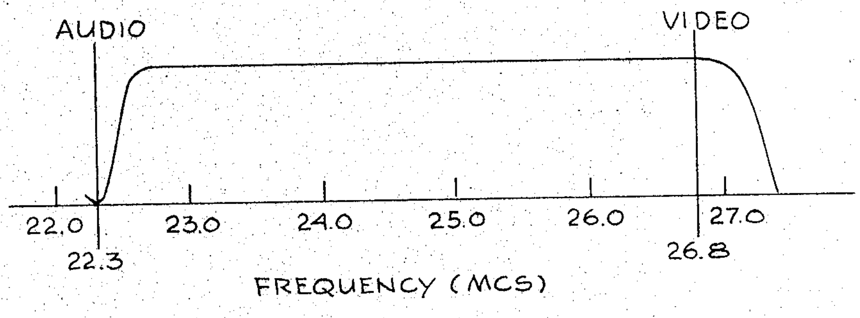
FIGURE 10 is a wave shape of a desired final intermediate frequency amplifier response characteristic.

The ghost may be eliminated very simply by making the final intermediate frequency amplifier response characteristic generally have the same shape as the transmitter response characteristic. This response characteristic is shown in FIGURE 10. It will be noted that this differs from the response characteristic shown in FIGURE 9 by the flat portion of the curve being extended above the video carrier frequency to a point substantially 0.75 megacycle beyond. As there is no sloping amplitude characteristic in the vicinity of the video carrier, no demodulation of the phase modulation components of the video carrier can occur.

Figure 11:
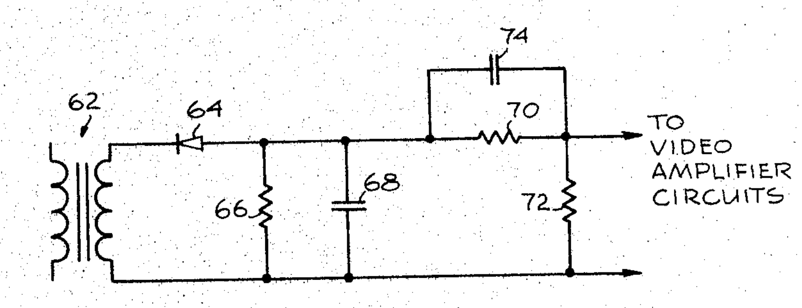
FIGURE 11 is a compensating network circuit to eliminate effects of an IF characteristic such as shown in FIGURE 10.

With the final intermediate frequency amplifier response characteristic as shown in FIGURE 10, the recovered video signal has the sideband components from 0 mc. to 0.75 mc. at twice the amplitude of the sideband components from 0.75 mc. to 4.0 mc. This amplitude characteristic of the detected video can be corrected by suitable networks before application to the video amplifier. One such network is shown in FIGURE 11, which is a circuit diagram thereof. The transformer 62 represents the IF transformer which is at the output of the final video IF amplifier. The video detector represented by the rectangle 58 will include a diode 64 having a load circuit including a resistor 66 and a shunt capacitor 68. The diode 64 has its anode connected to one end of the secondary of the IF transformer 62. The other end of the resistor 66 is connected to the other end of the secondary winding.

The compensating network includes a first resistor 70, which is connected in series with a second equal resistor 72. Output is taken across the resistor 72. A shunt capacitor 74 is connected across the resistor 70. This capacitor has its capacitance value selected so that its reactance, compared to the resistance value of resistor 70, is substantial over the range from 0 mc. to 0.75 mc. and negligible over the range from 0.75 mc. to 4.0 mc. As a result, that portion of the video signal between 0 mc. and 0.75 mc. has its amplitude reduced by half, and the overall response from 0 mc. to 4.0 mc. is therefore substantially flat.

Accordingly, by altering the frequency response characteristic of the final intermediate frequency amplifier and by properly compensating the output of the final video detector, any ghosts which may be caused by certain types of mixers are eliminated.

There has been described herein a novel, useful and simple arrangement for stabilizing the intermediate frequency of superheterodyne receivers despite errors in the tracking oscillator frequency. As a result of the error-correcting capability presented by this invention, there is made possible the manufacture of television tuners both UHF and VHF which need not have a fine tuning adjustment at all, but whose tuning may be pre-set at the factory.

We claim:

1. In a system wherein a receiver provides from received signals first intermediate frequency carrier signals and second frequency modulated intermediate frequency carrier signals, the frequency of said first intermediate carrier signal and the center frequency of said second intermediate frequency carrier signals being unstable, means for stabilizing said first and second intermediate frequency carrier signals comprising a first mixer circuit, a second mixer circuit, a source of stable frequency local oscillations, means for applying signals from said source of stable local frequency oscillations to said first mixer, means for applying said first intermediate frequency carrier signal to said first mixer circuit with a minimum amplitude which exceeds the maximum amplitude of signals from said source of local oscillations, means for deriving a third intermediate frequency carrier from said first mixer circuit output, means for applying said first and second intermediate frequency carrier signals to said second mixer input, means for applying said third intermediate frequency carrier to said second mixer input with an amplitude greater than the maximum amplitude of the applied first and second intermediate frequency carrier signals, and means for deriving from said second mixer output a fourth intermediate frequency carrier having the frequency of said local oscillator and a fifth frequency modulated intermediate frequency having a center frequency which is stable and displaced from said local oscillator frequency.

2. Apparatus for compensating for unwanted frequency variations in the first intermediate frequency output of a tuner, said first intermediate frequency output including an amplitude modulated carrier and a frequency modulated carrier, said apparatus comprising a first mixer circuit, a second mixer circuit, means for applying said first intermediate frequency output to said second mixer circuit, a source of stable frequency oscillations, means for applying signals from said source of stable frequency oscillations to said first mixer circuit, means for applying said amplitude modulated carrier to said first mixer circuit with a minimum amplitude which exceeds the maximum amplitude of signals from said source of stable frequency oscillations, means for deriving a second intermediate frequency carrier from said first mixer, means for applying said second intermediate frequency carrier to said second mixer with an amplitude which is greater than the maximum amplitude of the first intermediate frequency output signals applied to said second mixer whereby said second mixer produces an output including an amplitude modulated carrier having the frequency of said stable local oscillations and a frequency modulated carrier having a stable frequency related to the frequency of said stable frequency oscillations.

3. Apparatus as recited in claim 2 wherein said means for applying said first intermediate frequency carrier to said first mixer with a minimum amplitude which exceeds the maximum amplitude of said stable frequency oscillations includes amplitude limiting means for providing an output signal which is unmodulated and which is at the frequency of the input signal.

4. In a television receiver of the type wherein a tuner provides an output comprising a first video intermediate frequency carrier and a first audio intermediate frequency carrier and wherein said intermediate frequency carriers have frequency variations due to errors in the local oscillator in the said tuner, apparatus for eliminating said frequency errors from said intermediate frequency carriers comprising a first mixer circuit, a second mixer circuit, means for applying only said first video intermediate frequency carrier signal to said first mixer circuit, a source of stable frequency oscillations, means for applying signals from said source of stable frequency oscillations to said first mixer circuit, means for deriving a second intermediate frequency carrier at a frequency which is one of the sum or the difference of the frequencies of said inputs to said first mixer circuit, means for applying said first intermediate frequency video carrier and said first intermediate frequency audio carrier to said second mixer circuit, means for applying said second intermediate frequency carrier to said second mixer circuit, and means for deriving an output from said second mixer circuit comprising a third video intermediate frequency carrier at the frequency of said stable frequency oscillations and a stable audio frequency carrier having a stable frequency related to that of said stable frequency oscillations.

5. In a television receiver of the type including a tuner which provides an output which includes a first video intermediate frequency carrier and a first audio intermediate frequency carrier and which intermediate frequency carriers vary in frequency due to errors in the local oscillator of said tuner, means for compensating for said errors in frequency comprising a first mixer circuit, a source of stable frequency oscillations, means for applying said stable frequency oscillations to said first mixer circuit, means for applying only said first video intermediate frequency carrier to said first mixer circuit with a minimum amplitude which exceeds the maximum amplitude of said stable frequency oscillations, means for deriving an output from said first mixer circuit comprising a substantially unmodulated second intermediate frequency carrier having a frequency derived from the frequencies of the two inputs to said first mixer circuit, a second mixer circuit, means for applying said second intermediate frequency carrier to said second mixer circuit, means for applying said first video and audio intermediate frequency carrier outputs of said tuner to said second mixer circuit with a maximum amplitude which is less than the minimum amplitude of said second intermediate frequency carrier, means for deriving from said second mixer circuit an output including a video intermediate frequency carrier having the frequency of said stable frequency oscillations and a stable audio intermediate frequency carrier having a frequency related to the frequency of said stable frequency oscillations.

6. In a television receiver of the type wherein a tuner provides an output comprising a first video intermediate frequency carrier modulated by video and a first audio intermediate frequency carrier modulated by audio and wherein said intermediate frequency carriers have frequency variations, apparatus for eliminating said frequency errors from said intermediate frequency carriers comprising a first mixer circuit, a second mixer circuit, means for applying only said first video intermediate frequency carrier signal to said first mixer circuit, a source of stable frequency oscillations, means for applying signals from said source of stable frequency oscillations to said first mixer circuit, means for deriving a second intermediate frequency carrier at a frequency which is one of the sum or the difference of the frequencies of said inputs to said first mixer circuit, means for applying said first intermediate frequency video carrier and said first intermediate frequency audio carrier to said second mixer circuit, means for applying said second intermediate frequency carrier to said second mixer circuit, means for deriving an output from said second mixer circuit comprising a third video intermediate frequency carrier at the frequency of said stable frequency oscillations and a stable audio frequency carrier having a stable frequency related to that of said stable frequency oscillations, said third video intermediate frequency carrier being modulated by wanted video and unwanted signals, and means for preventing detection of said unwanted signals to keep them from interfering with said wanted video.

7. In a television receiver as recited in claim 6 wherein said means for preventing detection of said unwanted signals to keep them from interfering with said video signals includes a final video intermediate frequency amplifier coupled to the output of said second mixer circuit, said final video intermediate frequency amplifier having a flat frequency versus amplitude response characteristic extending on either side of said third video intermediate frequency to prevent slope detection of said unwanted video, and network means connected to receive said final video amplifier output for compensating for any alteration in amplitude relationships of said video signal due to said final video intermediate frequency amplifier.

8. In a television receiver of the type including a tuner which provides an output which includes a first video intermediate frequency carrier amplitude modulated with video signals and a first audio intermediate frequency carrier frequency modulated with audio signals and which intermediate frequency carriers vary in frequency, means for compensating for said errors in frequency comprising a first mixer circuit, a source of stable frequency oscillations, means for applying said stable frequency oscillations to said first mixer circuit, means for applying only said first video intermediate frequency carrier to said first mixer circuit with a minimum amplitude which exceeds the maximum amplitude of said stable frequency oscillations, means for deriving an output from said first mixer circuit comprising a substantially unmodulated second intermediate frequency carrier having a frequency derived from the frequencies of the two inputs to said first mixer circuit, a second mixer circuit, means for applying said second intermediate frequency carrier to said second mixer circuit, means for applying said first video and audio intermediate frequency carrier outputs of said tuner to said second mixer circuit with a maximum amplitude which is less than the minimum amplitude of said second intermediate frequency carrier, means for deriving from said second mixer circuit an output including a third video intermediate frequency carrier having the frequency of said stable frequency oscillations and a stable audio intermediate frequency carrier having a stable frequency fixedly displaced from the frequency of said stable frequency oscillations, said third video intermediate frequency carrier being modulated by desired and undesired video signals, a third intermediate frequency amplifier, means for shaping the third intermediate frequency amplifier frequency response curve to prevent demodulation of said undesired video signals, and network means coupled to the output of said third video amplifier for compensating for the effect of said third intermediate frequency amplifier frequency response curve on the desired video signals.

9. In a television receiver as recited in claim 8 wherein said network means comprises a first and a second resistor connected in series, means for applying output from said third intermediate frequency amplifier to said series connected first and second resistors, a capacitor connected across said first resistor, said capacitor having its value chosen such that its reactance is substantial when compared with said first resistor value over a predetermined range of frequencies, and means to derive an output from across said second resistor.

No references cited.

WILLIAM C. COOPER, *Acting Primary Examiner.*

A. H. GESS, *Assistant Examiner.*